US010721831B2

United States Patent
Straley et al.

(10) Patent No.: US 10,721,831 B2
(45) Date of Patent: Jul. 21, 2020

(54) ELECTRONICS CHASSIS COMPOUND CYLINDER PRESSURE VESSEL

(71) Applicant: Eagle Technology, LLC, Melbourne, FL (US)

(72) Inventors: G. Randall Straley, Melbourne, FL (US); Brian C. Strom, Melbourne Beach, FL (US); James B. Loafman, Indialantic, FL (US); Rebecca R. Coates, Satellite Beach, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 127 days.

(21) Appl. No.: 15/900,305

(22) Filed: Feb. 20, 2018

(65) Prior Publication Data

US 2019/0261529 A1 Aug. 22, 2019

(51) Int. Cl.
*F28D 21/00* (2006.01)
*H05K 5/06* (2006.01)
*H05K 5/02* (2006.01)
*H05K 7/20* (2006.01)

(52) U.S. Cl.
CPC .......... *H05K 5/068* (2013.01); *H05K 5/0247* (2013.01); *H05K 5/069* (2013.01); *H05K 7/20436* (2013.01)

(58) Field of Classification Search
CPC .......... H05K 1/0203; H05K 7/02; H05K 7/04; H05K 7/1418; H05K 7/142; H05K 7/1422; H05K 7/1427; H05K 7/1434; F28D 2021/0028; F28D 2021/0029
See application file for complete search history.

(56) References Cited

U.S. PATENT DOCUMENTS

| 3,596,140 | A | * | 7/1971 | Walsh | H05K 7/1434 361/784 |
| 4,400,858 | A | * | 8/1983 | Goiffon | E21B 47/011 138/108 |
| 4,858,068 | A | | 8/1989 | Bitller et al. | |
| 4,962,445 | A | | 10/1990 | Pelet et al. | |
| 6,404,637 | B2 | | 6/2002 | Hutchison et al. | |
| 6,434,317 | B1 | * | 8/2002 | Dyer | G02B 6/4428 385/139 |

(Continued)

FOREIGN PATENT DOCUMENTS

| EP | 2467005 A1 * | 6/2012 | ......... H05K 7/20236 |
| GB | 2533150 A * | 6/2016 | ......... H05K 7/20436 |
| WO | 2001013692 A1 | 2/2001 | |

*Primary Examiner* — Frantz F Jules
*Assistant Examiner* — Erik Mendoza-Wilkenfel
(74) *Attorney, Agent, or Firm* — Fox Rothschild LLP; Robert J. Sacco; Carol E. Thorstad-Forsyth

(57) ABSTRACT

Systems (100) and methods (1500) for using a pressure vessel. The methods comprise: obtaining the pressure vessel comprising a shell and an insert having an interference fit with the shell whereby the insert is locked in place within the shell via interfacial pressure; inserting at least one electronic component in a first hollow cavity formed in the insert; mechanically supporting the at least one electronic component using a structural feature of the insert; and transferring heat from the electronic component to an external environment via a heat transfer path that comprises a full surface area of the insert's outer surface abutting the shell's inner surface.

22 Claims, 14 Drawing Sheets

(56) References Cited

U.S. PATENT DOCUMENTS

| | | | |
|---|---|---|---|
| 7,180,736 B2* | 2/2007 | Glovatsky | H05K 7/1434 |
| | | | 361/688 |
| 9,494,753 B2* | 11/2016 | Kimbrell | H02G 15/115 |
| 9,581,358 B2 | 2/2017 | Bushby | |
| 2004/0100273 A1* | 5/2004 | Liney | F16L 53/37 |
| | | | 324/534 |
| 2005/0052844 A1* | 3/2005 | McCollum | H05K 5/0213 |
| | | | 361/689 |
| 2005/0068743 A1 | 3/2005 | Ferris et al. | |
| 2016/0100505 A1* | 4/2016 | Reid | H05K 7/20545 |
| | | | 361/714 |
| 2017/0208701 A1* | 7/2017 | Logan | H05K 7/1417 |

* cited by examiner

ELECTRONICS CHASSIS COMPOUND CYLINDER PRESSURE VESSEL

BACKGROUND

Statement of the Technical Field

The present document generally relates to pressure vessels for electronic equipment. More particularly, the present document relates to electronic chassis compound cylinder pressure vessel.

Description of the Related Art

A common approach to packaging electronics subjected to external hydrostatic pressure is to house the components in a pressure vessel. The pressure vessel housings can be spherical or cylindrical. A typical electronics chassis for a cylindrical pressure vessel is mechanically and thermally attached to an end cap or to a removable frame. Both approaches limit thermal conductivity and require multiple components leading to high cost and weight.

SUMMARY

The present solution concerns implementing systems and methods for using a pressure vessel. The methods comprise: obtaining the pressure vessel comprising a shell and an insert having an interference fit with the shell whereby the insert is locked in place within the shell via interfacial pressure; inserting at least one electronic component in a first hollow cavity formed in the insert; mechanically supporting the at least one electronic component using a structural feature of the insert; and transferring heat from the electronic component to an external environment via a heat transfer path that comprises a full surface area of the insert's outer surface abutting the shell's inner surface.

The methods also comprise coupling a cap to an end of the shell. In some scenarios, the cap has at least one of an electrical connector and a pressure relief valve coupled thereto. Additionally or alternatively, the cap comprises a hollow cavity facilitating wire routing or facilitating storage of a moisture control mechanism. The moisture control mechanism can be retained in the hollow cavity of the cap via a vented plate mechanically coupled to the cap. An environmental seal is provided between the cap and the shell.

In those or other scenarios, the shell and insert are formed of different materials that facilitate the transfer of heat from the electronic component to the external environment. The insert has an outer diameter that is larger than the shell's inner diameter when the insert and shell are at room temperature and not assembled. Once the shell and insert are assembled, the electronic component is mechanically coupled to the structural feature of the insert such that the electronic component's position in the insert is retained throughout use of the pressure vessel.

In those or yet other scenarios, the insert comprises a divider providing a gap for separating two electronic components inserted into the pressure vessel respectively through two opposing ends. Additionally or alternatively, a moisture control mechanism is stored in a second hollow cavity formed in the insert.

BRIEF DESCRIPTION OF THE DRAWINGS

The present solution will be described with reference to the following drawing figures, in which like numerals represent like items throughout the figures.

DETAILED DESCRIPTION

Figure 1:
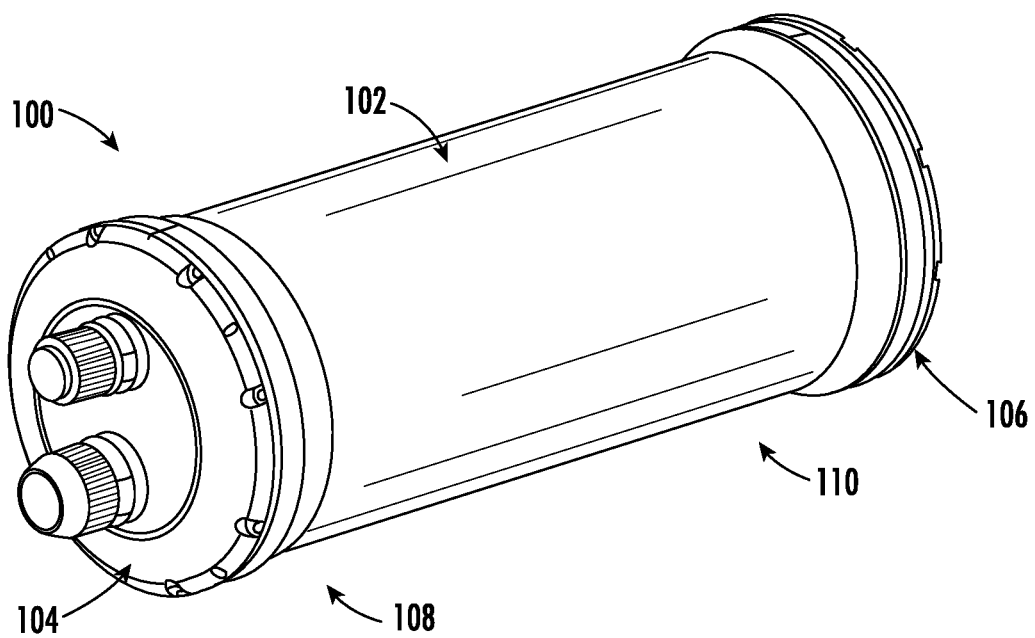
FIG. 1 is a perspective side view of an illustrative pressure vessel.
Figure 2:
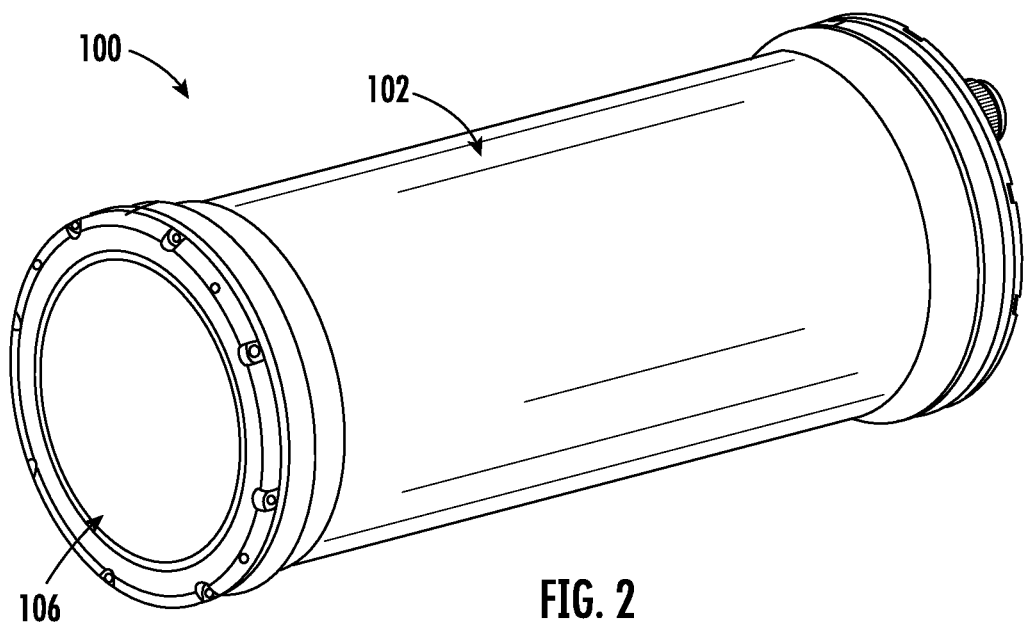
FIG. 2 is a perspective side view of the illustrative pressure vessel shown in FIG. 1.
Figure 3:
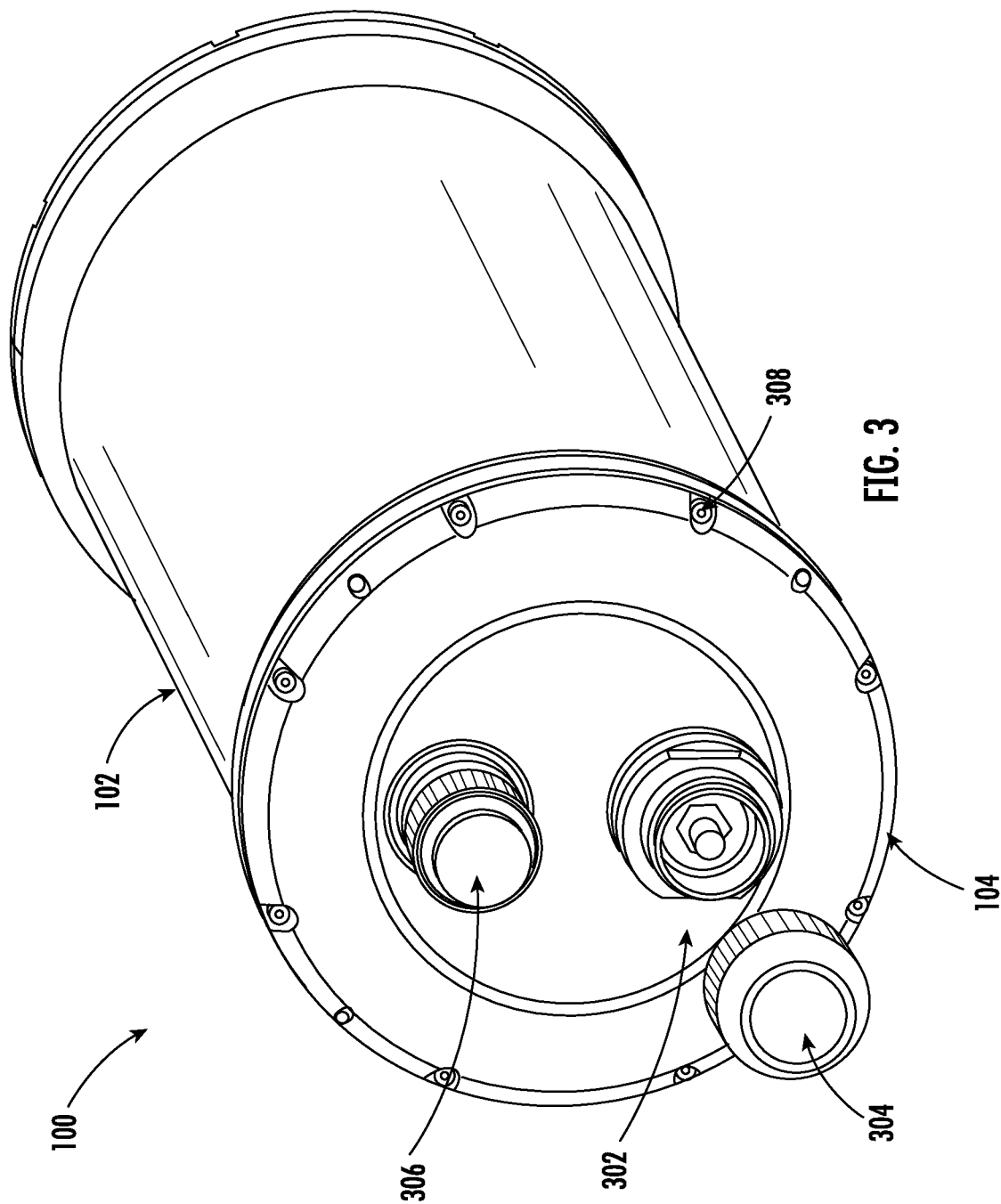
FIG. 3 is a perspective side view of the illustrative pressure vessel shown in FIG. 1.
Figure 4:
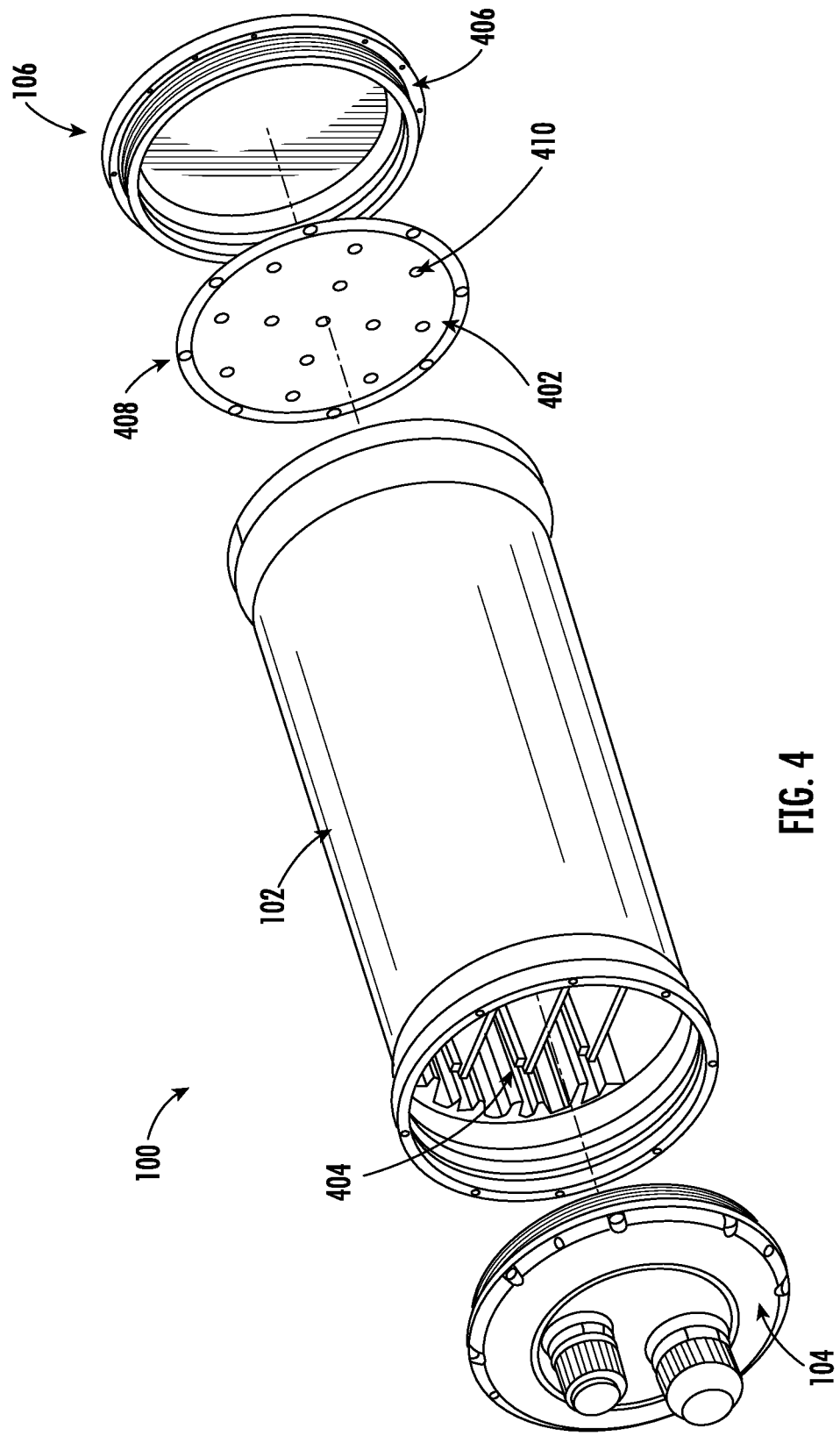
FIG. 4 is an exploded view of the illustrative pressure vessel shown in FIG. 1.
Figure 5:
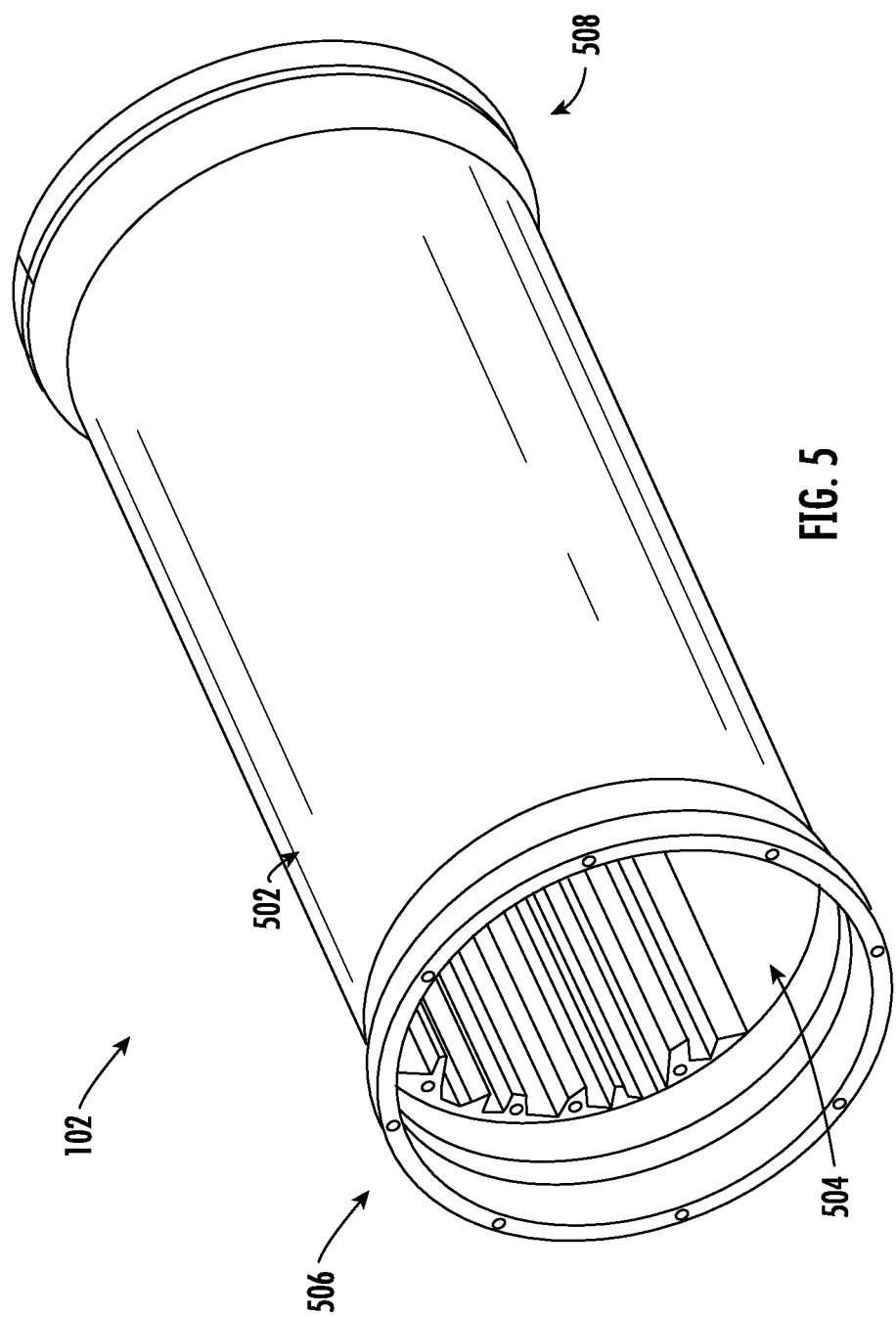
FIG. 5 is a perspective side view the illustrative pressure vessel shown in FIG. 1 with the caps and electronic components removed therefrom.
Figure 6:
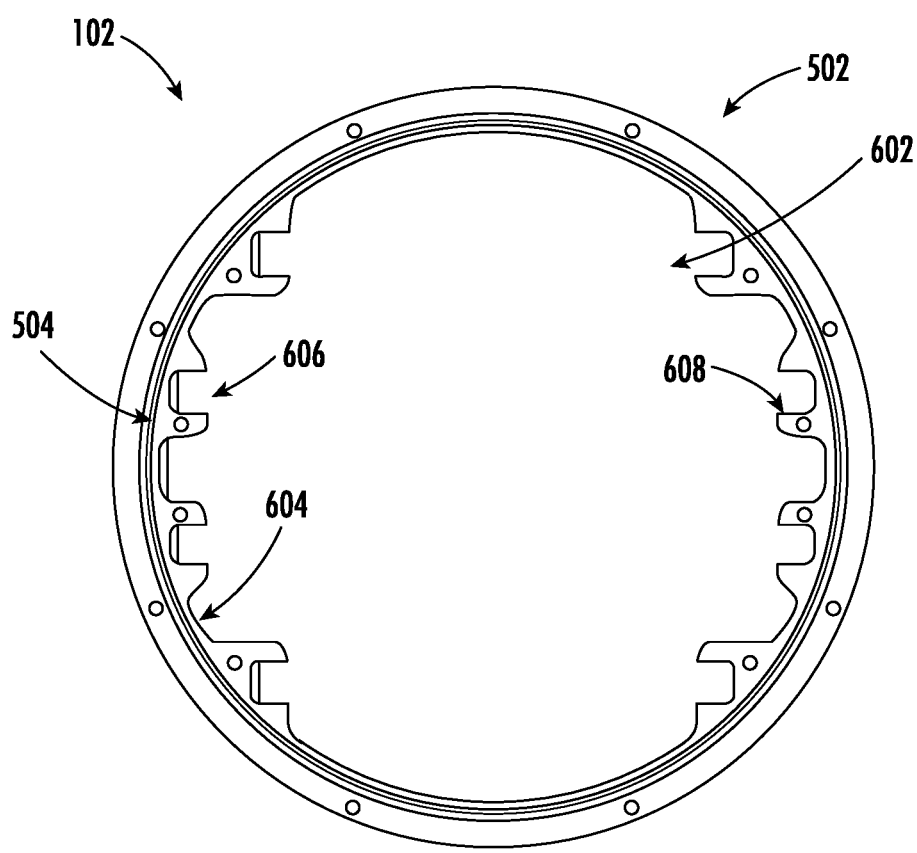
FIG. 6 is top view of the illustrative pressure vessel shown in FIG. 1.
Figure 7:
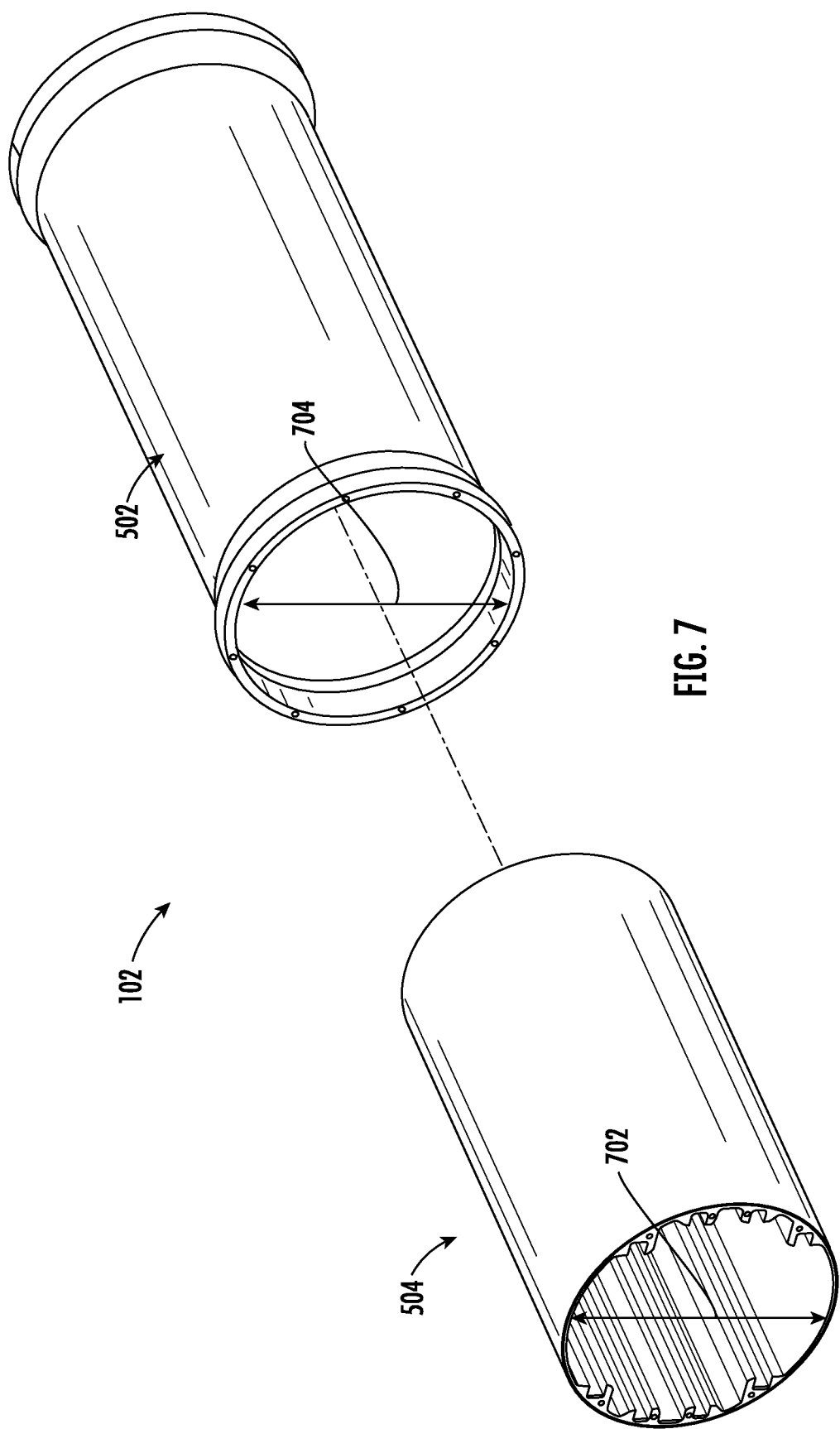
FIG. 7 is an exploded view of a body of the pressure vessel shown in FIG. 1.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present solution generally concerns an electronics chassis compound cylinder pressure vessel. The pressure vessel can be used to enclose electronics equipment subjected to different levels of external hydrostatic pressure along with varying external temperatures. The pressure vessel can be subjected to both fresh water and seawater environments along with varying corrosive and thermal conductivity environments.

The present solution utilizes two main components, namely a shell and an insert. The components are assembled using an interference-fit producing a compound cylinder. The insert provides 360 degrees of heat transfer surface area to maximize thermal transfer to the exterior of the shell. The pressure vessel is designed to have a minimized weight and a maximized thermal capacity. These features of the pressure vessel are achieved utilizing an aluminum or equivalently large thermal conductivity value inner insert and corrosion resistant metal outer shell.

The pressure vessel comprises an interference-fit pressure vessel tube assembly. The interference-fit is maintained over a wide temperature range. That is, the insert remains in place in a cold environment and both main components are not overstressed in hot environments. The present solution maximizes width for circuit card assemblies and maximizes internal surface area for heat transfer to the external environment. The present solution provides increased depth capacity by increasing the buckling capacity of the cylinder.

In order to assembly the present solution, the inner insert is cooled to reduce its outer diameter and is then slid onto the outer shell. Once assembled, the two main components are virtually cold-welded together increasing the holding capacity of the insert for shock and vibration events.

Referring now to FIGS. 1-4, there are provided illustrations of an illustrative pressure vessel 100 for housing electronic components 404. The electronic components can include, but are not limited to, thermal heat sinks and printed circuit boards with or without electronic circuit elements coupled thereto (e.g., chips, resistors, capacitors, inductors, etc.).

The pressure vessel 100 comprises a body 102 and two end caps 104, 106 respectively coupled to ends 108, 110 of the body. Each end cap 104, 106 is coupled to the body via a mechanical coupler (e.g., screws 308 and/or mating threads 406 facilitating a threaded engagement therebetween). A first end cap 104 has at least one electrical connector 306 and pressure relief valve 302 provided therewith. Electrical connectors and pressure relief valves are well known in the art, and therefore will not be described herein. Any known or to be known electrical connector and/or pressure relief valve can be used herein without limitation. The pressure relief valve 302 provides a way to allow a fluid to flow out of the body 102 (e.g., moist air) and/or allow a fluid to flow into of the body 102 (e.g., dry air). In this regard, the pressure relief valve 302 includes, but is not limited to, a schrader valve. A cover 304 is provided to shield the pressure relief valve 302 from any damage caused by an applied external force. The cover 304 is coupled to the pressure relieve value 302 via a mechanical coupler (e.g., mating threads facilitating a threaded engagement therebetween).

Figure 11:
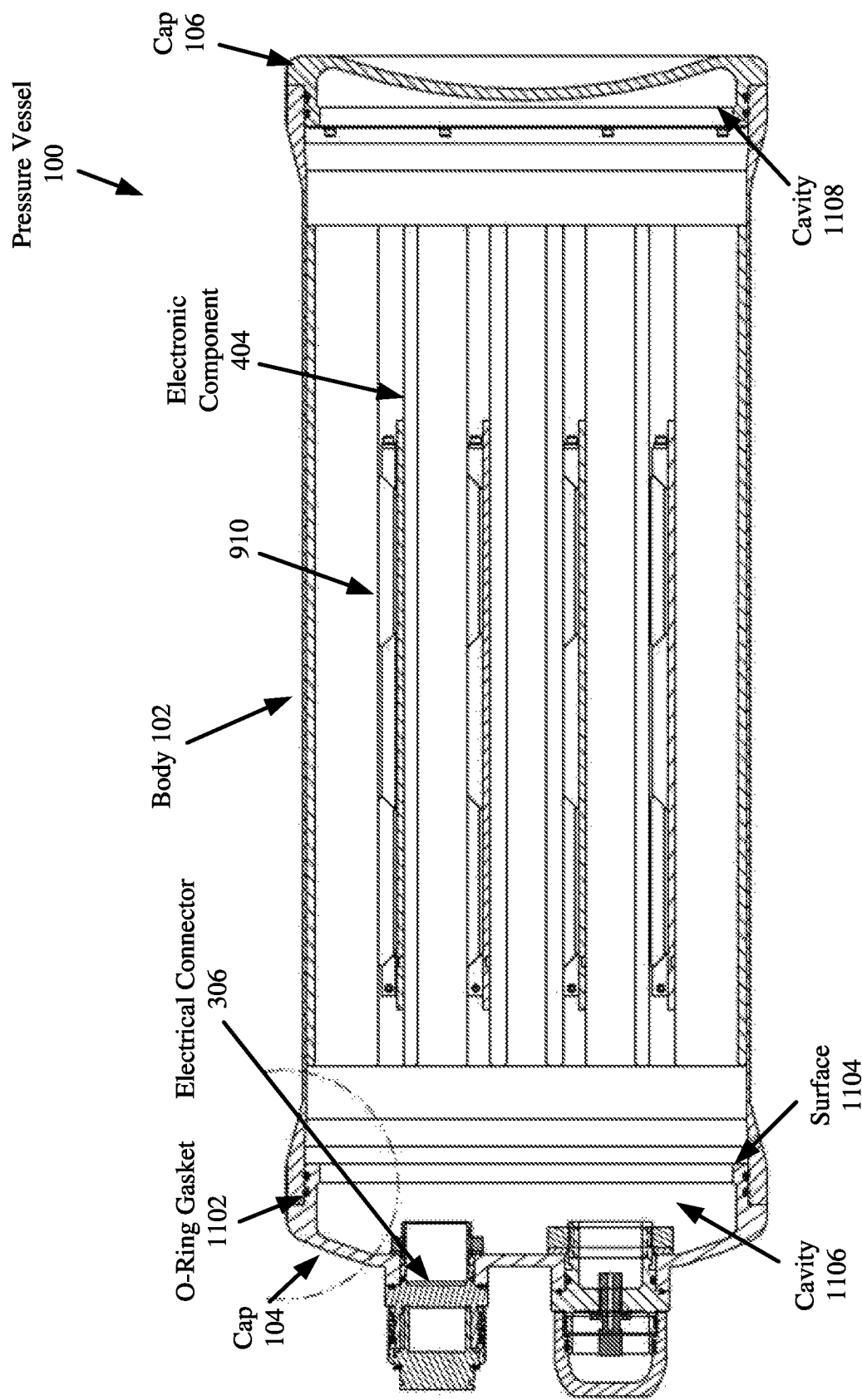
FIG. 11 is a cross sectional view of the pressure vessel's body with electronic components disposed therein.

An environmental seal is provided between each end cap 104, 106 and the body 102. As shown in FIG. 11, the environmental seal is achieved through the use of one or more O-ring gaskets 1102. The O-ring gaskets 1102 can be located at any suitable location between the respective cap and the body. Therefore, although the O-ring gaskets 1102 are shown in FIG. 11 as radial gaskets encompassing a sidewall of the body 102, the present solution is not limited in this regard. Alternatively or additionally, an O-ring gasket is provided such that it abuts end surface 1104 of the body 102.

As also shown in FIG. 11, caps 104, 106 have hollow internal cavities 1106, 1108. The cavity 1106 provides space to allow wires to be routed from an electrical connector 306 to one or more electronic components 404 disposed within the pressure vessel 100. One or both of the cavities 1108 provide(s) a space to store other items, such as a moisture control mechanism. Moisture control mechanisms are well known in the art, and therefore will not be described herein. Any known or to be known moisture control mechanism can be used herein without limitation. For example, moisture control desiccant is stored in cavity 1108. The moisture control desiccant (in a solid form) is retained in the cavity 1108 via a plate 402. The plate 402 is securely coupled to the cap 106 via mechanical couplers 408 (e.g., screws). One or more apertures 410 is(are) formed through the plate 402 to allow venting for the desiccant. The present solution is not limited to the particulars of this example.

Referring now to FIGS. 5-8, the body 102 comprise a shell 502 and an insert 504. The shell 502 comprises a hollow shaft with two opposing open ends 506, 508. Each end 506, 508 is configured to be coupled to a respective end cap 104, 106 as discussed above. The shell 502 is formed of a material that can structurally withstand relatively high pressures (e.g., high water pressure). For example, the shell 502 is formed of a metal such as stainless steel and titanium. The present solution is not limited to the particulars of this example.

The insert 504 is formed of a material different than that of the shell 502. The insert 504 is formed of a material that is lighter than that used to form the shell. For example, the insert 504 is formed of aluminum for weight saving and heat transfer capabilities. The present solution is not limited to the particulars of this example. The material used for insert is selected in accordance with the strength and stress requirements of any given application.

Figure 8:
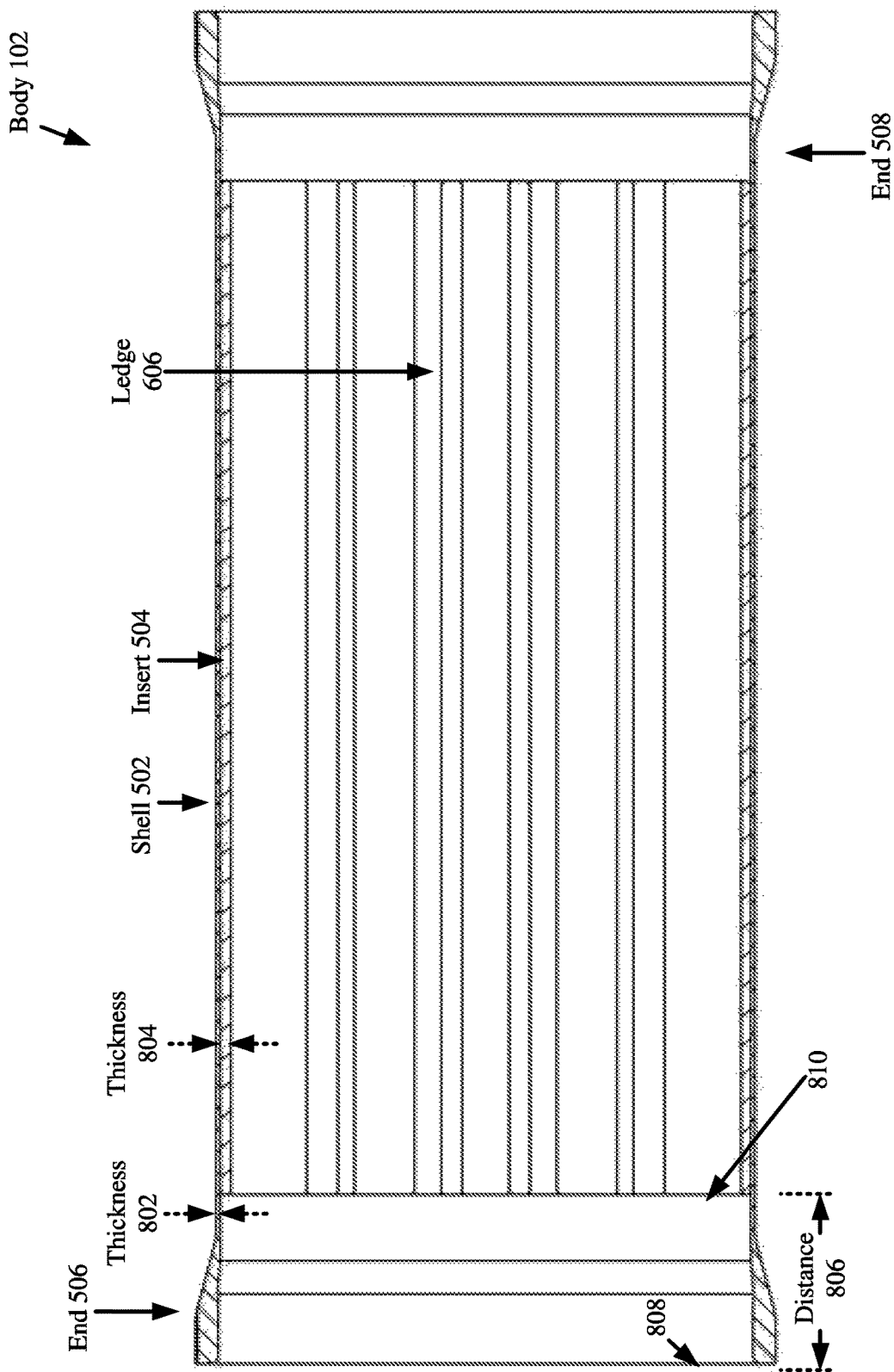
FIG. 8 is a cross sectional view of the pressure vessel's body.

The thicknesses 802, 804 of the shell 502 and insert 504 are selected in accordance with a given application (e.g., applied stress, thermal resistance, applied hydrostatic pressure, etc.). As shown in FIG. 8, the thickness 804 of the insert 504 is designed (a) to be larger than the shell's thickness 802 to address deflection and stress issues of a given application and (b) to be relatively thin so as to minimize thermal resistance thereof. The present solution is not limited to the particulars of this architecture. In other scenarios, the pressure vessel 100 is to be used in relatively deep water or be subjected to a relatively high hydrostatic pressure. Accordingly, the thickness 802 of the shell 502 and/or the thickness 804 of the insert 504 is made larger than that shown in FIG. 8. In yet other scenarios, the thicknesses 802, 804 have the same values. The distance between the insert's end surface 810 and the shell's end surface 808 is also selected in accordance with a given application.

The components 502, 504 are assembled using an interference-fit. In this regard, it should be understood that the insert 504 has an external diameter 702 that exceeds an inner diameter 704 of the shell 502 when both components 502, 504 are at room temperature and not assembled. For example, in some scenarios, the external diameter 702 is 0.003-0.020 inches larger than the inner diameter 704 (e.g., 8, 10 or 12 inches) when components 502, 504 are at room temperature. The present solution is not limited to the particulars of this example.

In order to assemble the components 502, 504, the insert 504 is cooled to a given temperature such that its external diameter 702 decreases. The shell 502 may also be heated to a given temperature such that its inner diameter 704 increases. Next, the insert 504 is pulled into the shell 502. The shell 502 and/or insert 504 is(are) then allowed to return to room temperature. At this time, the shell and insert are fastened together via a true interference fit (whereby the insert is locked in place within the shell via interfacial pressure). As a result of the true interference fit, no other components are required to urge or otherwise cause the two components 502, 504 to be fastened to, locked to or come in contact with each other. Therefore, the present solution is less complex and costly as compared to conventional pressure vessels. Once assembled, the two components 502, 504 are virtually cold-welded together increasing the holding capacity of the insert for shock and vibration events.

Also, the true interference fit allows a maximization of heat transfer between the insert 504 and the shell 502. Notably, the heat transfer path comprises the full surface area of the insert (i.e., diameter times length). This feature of the present solution is not found in conventional pressure vessels since they do not comprise true interference fits (i.e., the insert has to be urged towards the shell).

The insert 504 has a hollow cavity 602 sized and shaped to receive one or more electronic components 404. The inner surface 604 of the insert 504 is designed to structurally support the electronic component(s) 404 while being housed in the body 102, as well as facilitate the retention of the electronic component(s) 404 in their given positions throughout use of the pressure vessel 100. The structural support is facilitated by pairs of horizontally aligned ledges 606, 608.

Figure 9:
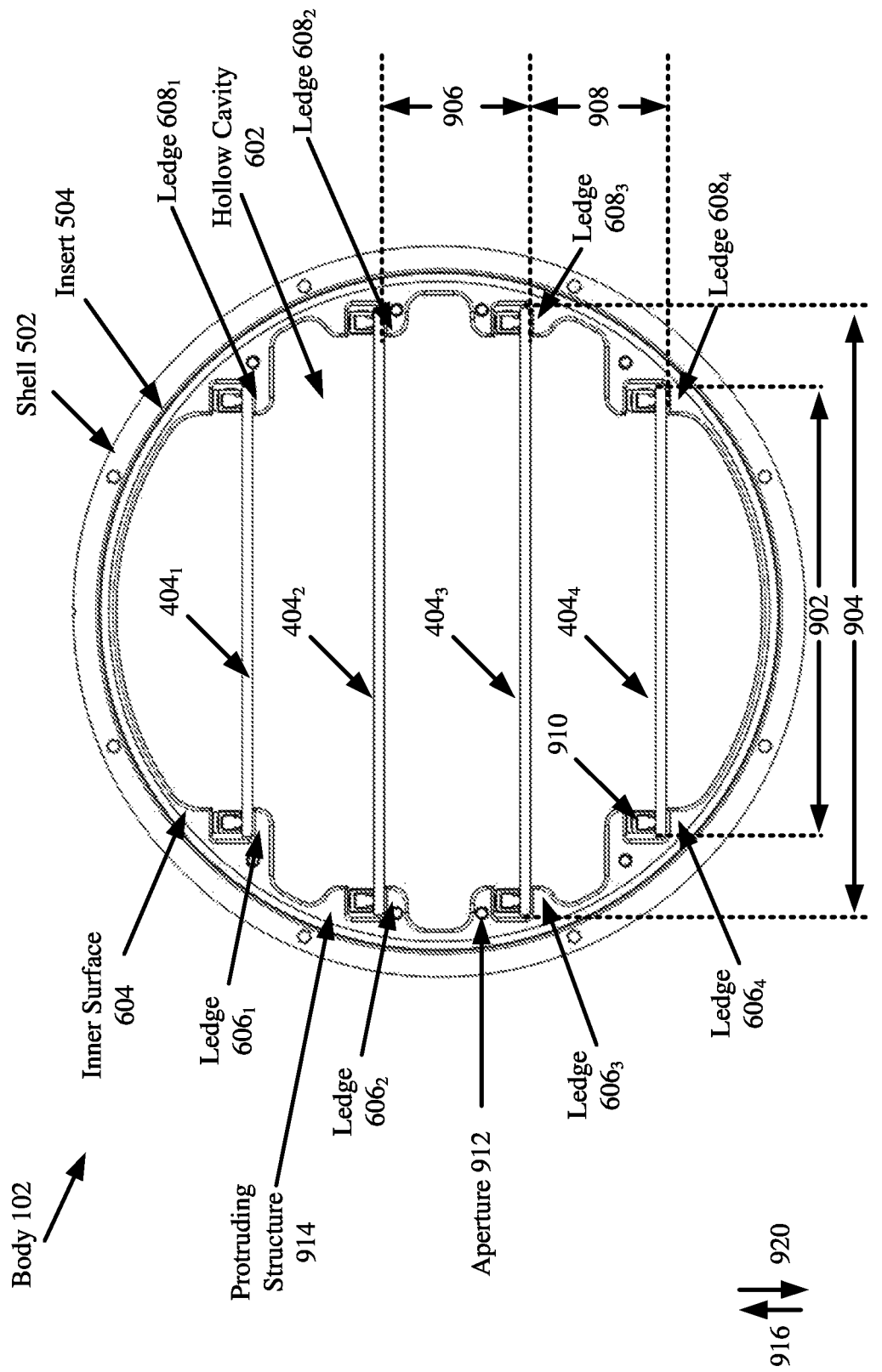
FIG. 9 is a top view of the illustrative pressure vessel shown in FIG. 1 with a plurality of electronic components disposed therein.
Figure 10:
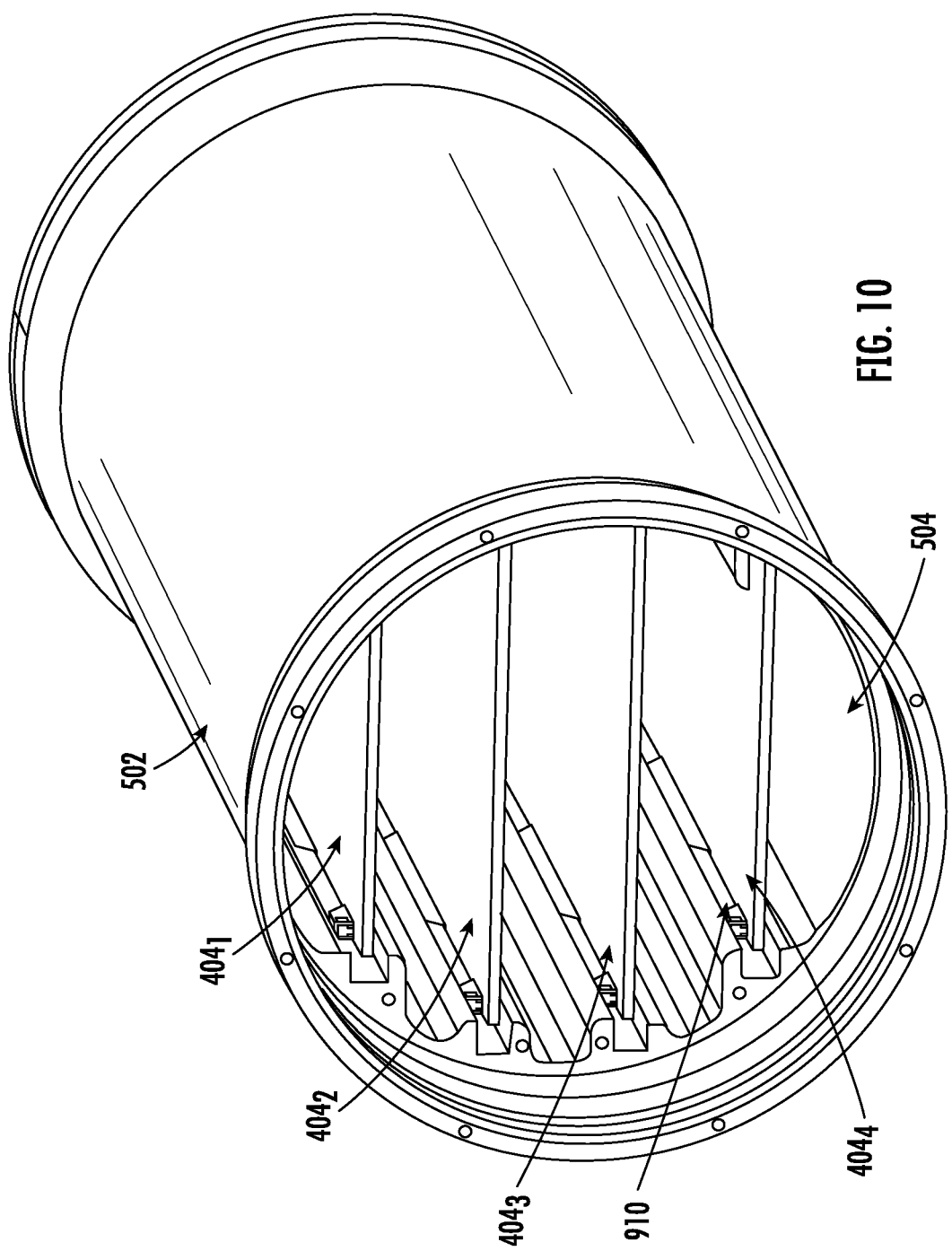
FIG. 10 is a side perspective view of the pressure vessel's body with electronic components disposed therein.

An illustration of a plurality of electronic components disposed in the body 102 is provided in FIG. 9. As shown in FIG. 9, four electronic components $404_1$, $404_2$, $404_3$, $404_4$ are disposed in the body 102. The electronic components $404_1$, $404_2$, $404_3$, $404_4$ reside in the hollow cavity 602 so as to be structurally supported by and in direct contact with the inner surface 604 of the insert 504. More specifically, a first electronic component $404_1$ is supported by opposing ledges $606_1$, $608_1$. A second electronic component $404_2$ is supported by opposing ledges $606_2$, $608_2$. A third electronic component $404_3$ is supported by opposing ledges $606_3$, $608_3$.

A fourth electronic component $404_4$ is supported by opposing ledges $606_4$, $608_4$. The electronic components $404_1$, $404_4$ have the same width 902, while the electronic components $404_2$, $404_3$ have the same widths 904. Widths 904 are larger than widths 902.

The electronic components $404_1$, $404_2$, $404_3$, $404_4$ are shown in FIG. 9 as comprising planar heat sinks. Circuit boards may be coupled to one or both sides of each planar heat sink. Electronic components (e.g., chips and/or passive components (i.e., resistors, capacitors and/or inductors)) may protrude out and away from the circuit boards. These circuit boards are not shown in FIG. 9 for drawing simplification reasons. The distance between adjacent ledges is selected to ensure that the protruding electronic components of two adjacent circuit boards do not come in contact with one another. Adjacent ledges $606_2/606_3$, $608_2/608_3$ have a distance 906 therebetween, while adjacent ledges $606_1/606_2$, $606_3/606_4$, $608_1/608_2$, $608_3/608_4$ have a distance 908 therebetween. Distance 906 is larger than distance 908.

The present solution is not limited to the particulars of the scenario presented in FIG. 9. Any number of electronic components can be disposed and housed in body 102. The electronic components can all have the same or different sizes (e.g., widths) and/or distances therebetween. Accordingly, the shape of the inner surface 604 can be different than that shown in FIG. 9 in other applications (e.g., when a different number of (e.g., less than or greater than 4) electronic components are to be housed in the body 102, when all of the electronic components all have the same widths 902 or 904, when the electronic components are to be held in a vertical arrangement rather than a horizontal arrangement shown in FIG. 9, and/or when the weight of the insert can be larger than the given application).

Figure 12:
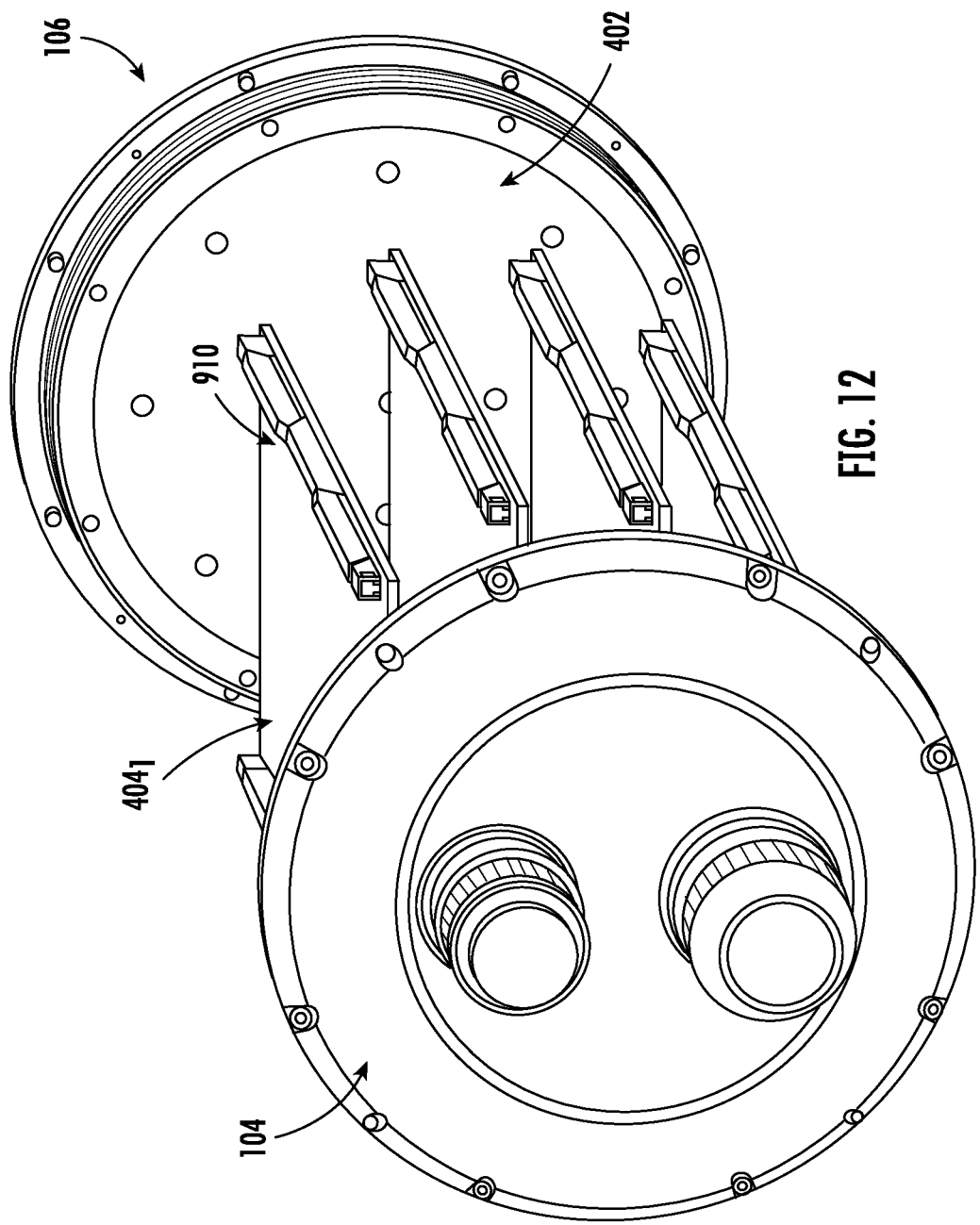
FIG. 12 is an illustration that is useful in understanding mechanical couplers for securing electronic components to the pressure vessel.

The electronic components are mechanically secured to the ledges. For example, as shown in FIG. 9, the electronic components $404_1$, $404_2$, $404_3$, $404_4$ are secured to the respective ledges via card locks 910. The card locks are selected to facilitate the transfer of heat from the electronic components (e.g., chips and/or passive components (i.e., resistors, capacitors and/or inductors)) to the external environment through the circuit board, heat sink, insert and/or shell. Accordingly, the card locks 910 include, but are not limited to, wedge locks (as shown in FIGS. 9 and 12) (allows thermal transfer in direction 916 and not in direction 920), cool locks (operate similar to a wedge lock but allows thermal transfer in both directions 916, 920), bolts, and/or clamps. In the wedge locks and cool locks scenarios, the top protruding structures 914 are needed to facilitate the mechanical coupling of the electronic components $404_1$, $404_2$, $404_3$, $404_4$ to the insert 504. In the bolt and clamp scenarios, the top protruding structures 914 are not needed, and therefore can be eliminated.

As shown in FIG. 9, the insert 504 comprises a plurality of apertures 912 formed therein. These apertures 912 provide means to mount additional components within the pressure vessel 100. Notably, the apertures 912 are optional features of the insert 504.

Figure 13:
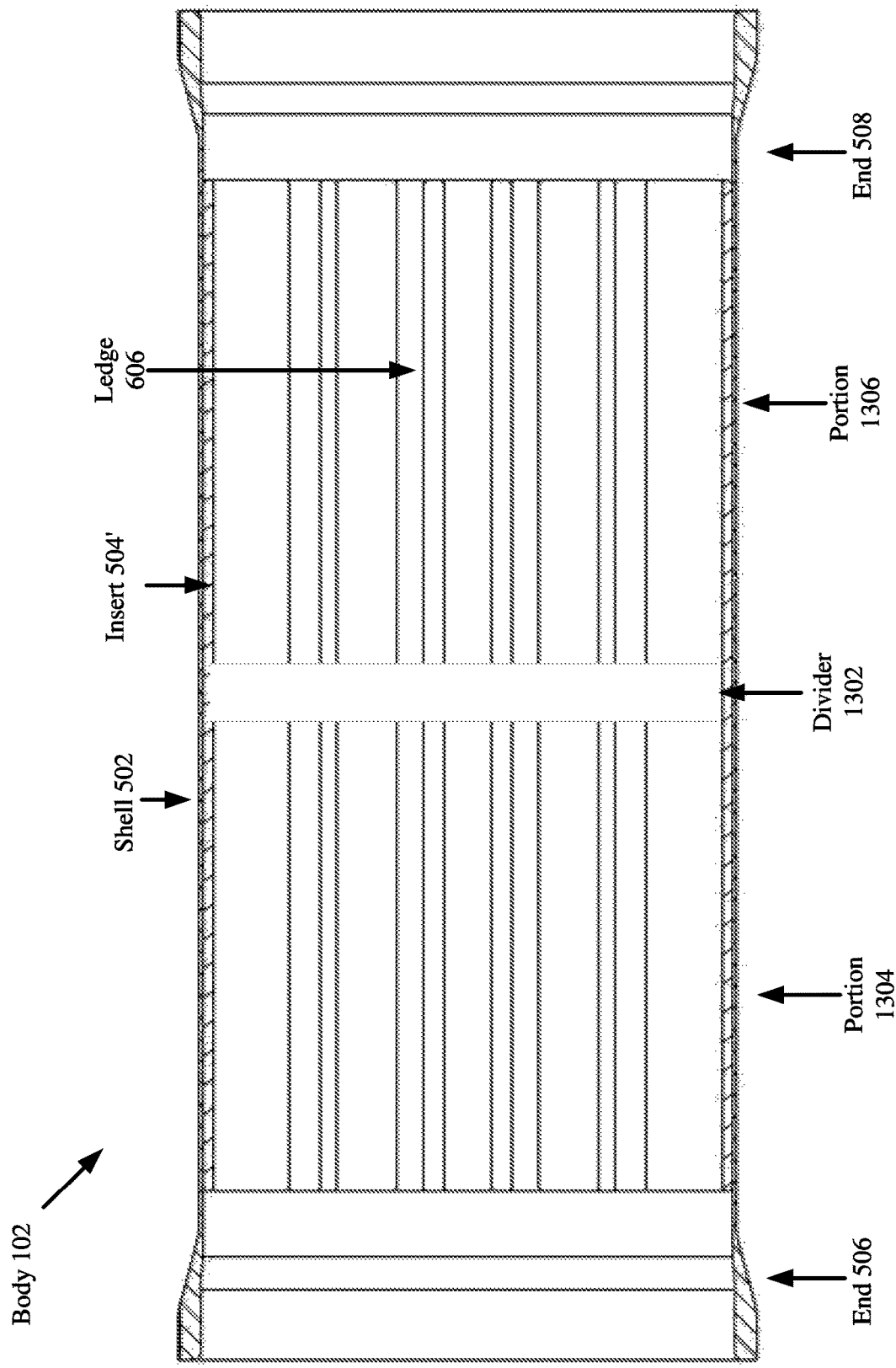
FIG. 13 is a cross sectional view of a pressure vessel having an insert with a divider.

The present solution is not limited to the particular architecture shown in FIGS. 1-12. For example, as shown in FIG. 13, the insert 104' is designed such that it comprises a divider 1302. The divider 1302 can simply be implemented as a space or gap between portion 1304, 1306. This arrangement allows for two different sets of electronic components to be inserted into and housed within the pressure vessel, i.e., a first set of electronic components are inserted into the left side end 506 of the shell 502 and a second set of electronic components are inserted into the right side end 508 of the shell 502. The electronic components of the first set are thermally isolated from the electronic components of the second set via the space or gap. The present solution is not limited to the particulars of this scenario. The insert can be designed in accordance with any given application.

Figure 14:
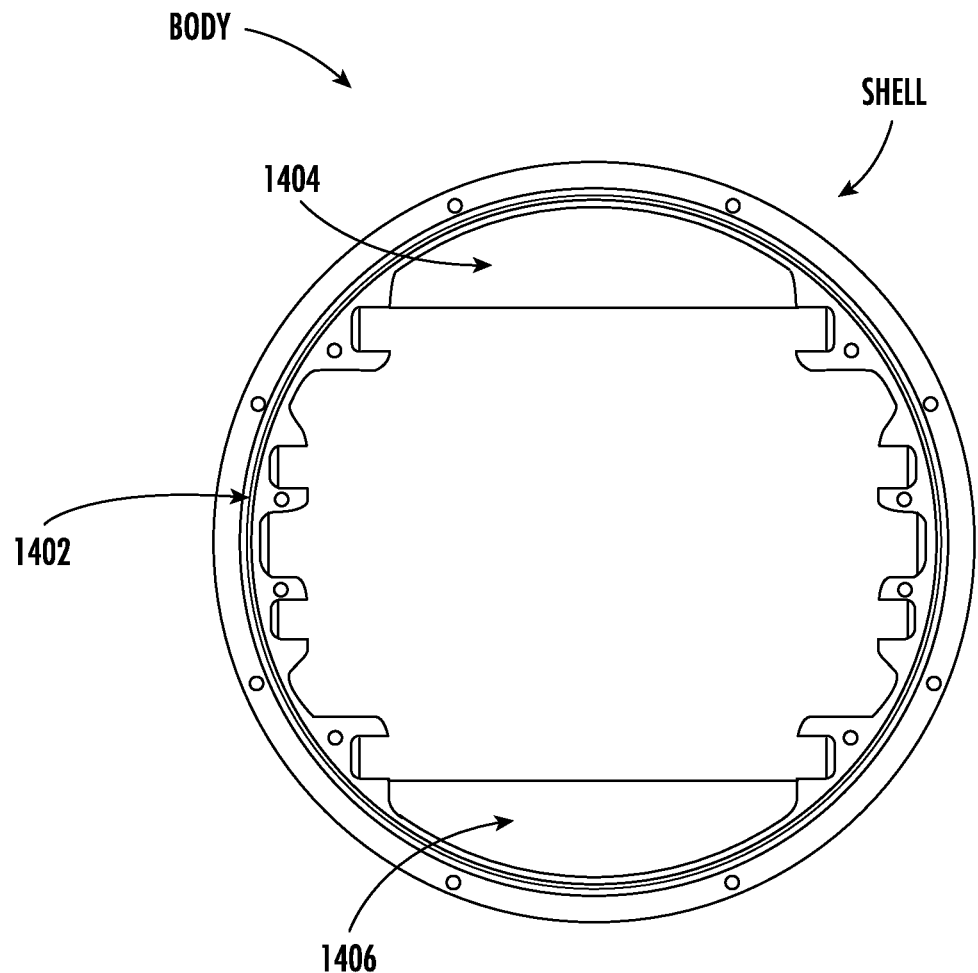
FIG. 14 is a top view of an insert with cavities for housing other items (e.g., a moisture control mechanism).

In FIG. 14, the insert 1402 is designed such that it comprises two cavities 1404, 1406 for storing other objects or items in the pressure vessel. The other objects or items can include, but are not limited to, moisture control mechanisms. Moisture control mechanisms are well known in the art, and therefore will not be described herein. Any known or to be known moisture control mechanism can be used herein without limitation. For example, moisture control desiccant is stored in at least one cavity 1404, 1406.

Figure 15:
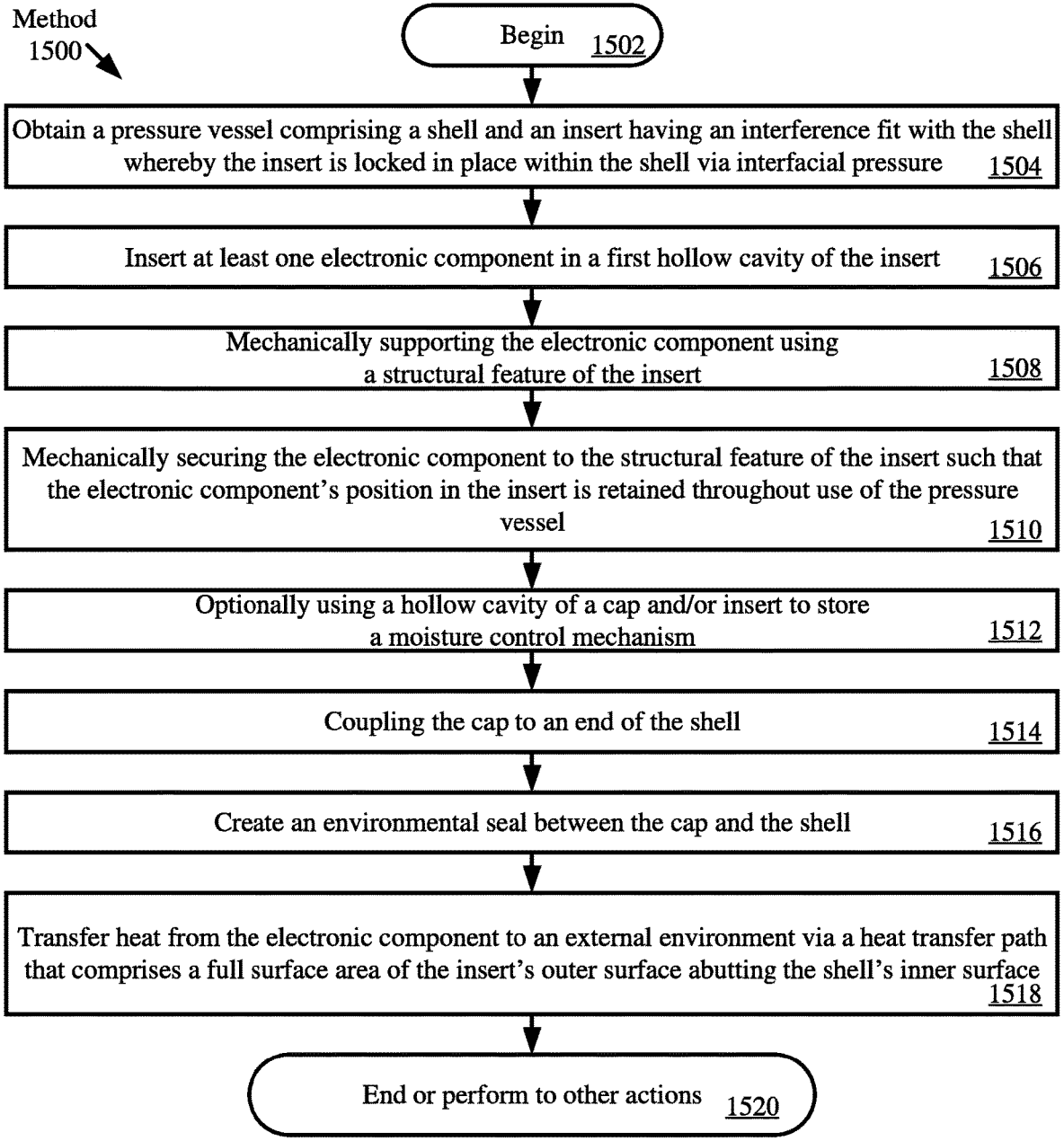
FIG. 15 is a flow diagram of an illustrative method for using a pressure vessel.

Referring now to FIG. 15, there is provided a method 1500 for using a pressure vessel (e.g., pressure vessel 100 of FIG. 1). Method 1500 begins with 1502 and continues with 1504 where the pressure vessel is obtained. The pressure vessel comprising a shell (e.g., shell 502 of FIG. 5) and an insert (e.g., insert 504 of FIG. 5). The insert has an interference fit with the shell whereby the insert is locked in place within the shell via interfacial pressure. In 1506, at least one electronic component (e.g., electronic component 404 of FIG. 4 or $404_1$, $404_2$, $404_3$, $404_4$ of FIG. 9) is inserted in a first hollow cavity (e.g., hollow cavity of 602 of FIG. 6) formed in the insert. The electronic component is mechanically supported by a structural feature (e.g., ledges of 606, 608 of FIG. 6) of the insert, as shown by 1508. The electronic component is mechanically secured to the insert's structural feature, as shown by 1510. The mechanical securement is provided such that the electronic component's position in the insert is retained throughout use of the pressure vessel.

In some scenarios, a hollow cavity (e.g., hollow cavity 1106 and/or 1108 of FIG. 11) of a cap (e.g., cap 104 or 106 of FIG. 1) and/or a hollow cavity (e.g., hollow cavity 1404 and/or 140 of FIG. 14) the insert is used to store a moisture control mechanism, as shown by optional 1512. The cap is coupled to the end of the shell in 1514. In some scenarios, the cap has An environmental seal is created between the cap and shell in 1516 (e.g., via O-ring gaskets 1102 of FIG. 11). In 1518, heat is transferred from the electronic component to an external environment via a heat transfer path. The heat transfer path comprises a full surface area of the insert's outer surface abutting the shell's inner surface. Subsequently, 1520 is performed where method 1500 ends or other actions are taken (e.g., remove the electronic components from the pressure vessel).

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. A method for using a pressure vessel, comprising:
    obtaining the pressure vessel comprising a shell and a single piece tubular insert have (i) an outer surface with a circle-shaped cross-sectional profile, (ii) a length that extends from a first end of the shell to a second opposing end of the shell, and (iii) an interference fit exclusively with the shell whereby the single piece tubular insert (1) is locked in place within the shell via interfacial pressure and (2) provides a 360 degrees of heat transfer surface area;
    inserting at least one eletronic component in a first hollow cavity formed in the single piece tubular insert;
    mechanically supporting the at least one electronic component using a structural feature of the single piece tubular insert; and
    transferring heat from the electronic component to an external environment via a heat transfer path that comprises a full surface area of the single piece tubular insert's outer surface abutting the shell's inner surface.

2. The method according to claim 1, further comprising coupling a cap to an end of the shell.

3. The method according to claim 2, wherein the cap has at least one of an electrical connector and a pressure relief valve coupled thereto.

4. The method according to claim 2, wherein the cap comprises a hollow cavity facilitating wire routing or facilitating storage of a moisture control mechanism.

5. A method for using a pressure vessel, comprising:
    obtaining the pressure vessel comprising a shell and an insert having an interference fit with the shell whereby the insert is locked in place within the shell via interfacial pressure;
    inserting at least one electronic component in a first hollow cavity formed in the insert;
    mechanically supporting the at least one electronic component using a structural feature of the insert;
    transferring heat from the electronic component to an external environment via a heat transfer path that comprises a full surface area of the insert's outer surface abutting the shell's inner surface; and
    coupling a cap to an end of the shell;
    wherein the cap comprises a hollow cavity facilitating storage of a moisture control mechanism; and
    wherein the moisture control mechanism is retained in the hollow cavity of the cap via a vented plate mechanically coupled to the cap.

6. The method according to claim 2, wherein an environmental seal is provided between the cap and the shell.

7. The method according to claim 1, wherein the shell and the single piece tubular insert are formed of different materials that facilitate the transfer of heat from the electronic component to the external environment.

8. The method according to claim 1, wherein the single piece tubular insert has a diameter that is larger than the shell when the single piece tubular insert and shell are at room temperature and not assembled.

9. The method according to claim 1, further comprising mechanically securing the electronic component to the structural feature of the single piece tubular insert such that the electronic component's position in the single piece tubular insert is retained throughout use of the pressure vessel.

10. The method according to claim 1, wherein the single piece tubular insert comprises a divider providing a gap for separating two electronic components inserted into the pressure vessel respectively through two opposing ends.

11. The method according to claim 1, further comprising storing a moisture control mechanism in a second hollow cavity formed in the single piece tubular insert.

12. A pressure vessel, comprising:
    a shell; and a single piece tubular insert having (i) an outer surface with a circle-shaped cross-sectional profile, (ii) a length that extends from a first end of the shell to a second opposing end of the shell, and (iii) an interference fit exclusively with the shell whereby the single piece tubular insert (1) is locked in place within the shell via interfacial pressure and (2) provides a 360 degrees of heat transfer surface area, the single piece tubular insert comprising a first hollow cavity sized and shaped to receive at least one electronic component when inserted into the pressure vessel, and a structural feature to provide mechanical support to the at least one electronic component when inserted into the pressure vessel;

wherein heat is transferred from the electronic component to an external environment via a heat transfer path that comprises a full surface area of the single piece tubular insert's outer surface abutting the shell's inner surface.

13. The pressure vessel according to claim 12, further comprising a cap coupled to an end of the shell.

14. The pressure vessel according to claim 13, wherein the cap has at least one of an electrical connector and a pressure relief valve coupled to the cap.

15. The pressure vessel according to claim 13, wherein the cap comprises a hollow cavity facilitating wire routing or facilitating storage of a moisture control mechanism.

16. A pressure vessel, comprising:

a shell;

an insert having an interference fit with the shell whereby the insert is locked in place within the shell via interfacial pressure, the insert comprising a first hollow cavity sized and shaped to receive at least one electronic component when inserted into the pressure vessel, and a structural feature to provide mechanical support to the at least one electronic component when inserted into the pressure vessel;

a cap coupled to an end of the shell;

wherein heat is transferred from the electronic component to an external environment via a heat transfer path that comprises a full surface area of the insert's outer surface abutting the shell's inner surface;

wherein the cap comprises a hollow cavity facilitating wire routing or facilitating storage of a moisture control mechanism; and wherein the moisture control mechanism is retained in the hollow cavity of the cap via a vented plate mechanically coupled to the cap.

17. The pressure vessel according to claim 13, wherein an environmental seal is provided between the cap and the shell.

18. The pressure vessel according to claim 12, wherein the shell and single piece tubular insert are formed of different materials that facilitate the transfer of heat from the electronic component to the external environment.

19. The pressure vessel according to claim 12, wherein the single piece tubular insert has a diameter that is larger than a diameter of the shell when the single piece tubular insert and shell are at room temperature and not assembled.

20. The pressure vessel according to claim 12, wherein the at least one electronic component is mechanically secured to the structural feature of the single piece tubular insert such that the at least one electronic component's position in the single piece tubular insert is retained throughout use of the pressure vessel.

21. The pressure vessel according to claim 12, wherein the single piece tubular insert comprises a divider providing a gap for separating two electronic components inserted into the pressure vessel respectively through two opposing ends.

22. The pressure vessel according to claim 12, further comprising a moisture control mechanism stored in a second hollow cavity formed in the single piece tubular insert.

* * * * *